United States Patent [19]

Micic et al.

[11] Patent Number: 5,023,702
[45] Date of Patent: Jun. 11, 1991

[54] SEMICONDUCTOR DEVICE, METHOD OF MANUFACTURING THE SAME, AND APPARATUS FOR CARRYING OUT THE METHOD

[75] Inventors: Lyubomir Micic, Freiburg; Günter Gärtlein, Freiamt; Eberhard Schmitt; Axel Müller, both of Freiburg; Egon Seng, Kenzingen-Hecklingen; Siegfried Spindler, Waldkirch, all of Fed. Rep. of Germany

[73] Assignee: Deutsche ITT Industries GmbH, Freiburg, Fed. Rep. of Germany

[21] Appl. No.: 399,667

[22] Filed: Aug. 4, 1989

[51] Int. Cl.⁵ .................. H01L 23/04; H01L 23/48
[52] U.S. Cl. ................................... 357/74; 357/69
[58] Field of Search ........................ 357/72, 74, 69

[56] References Cited

U.S. PATENT DOCUMENTS

| | | | |
|---|---|---|---|
| 3,002,133 | 9/1961 | Maiden et al. | 357/72 |
| 3,127,285 | 3/1964 | Gedgaudas et al. | 117/230 |
| 3,165,812 | 1/1965 | Takahashi et al. | 29/25.3 |
| 3,200,311 | 8/1965 | Thomas et al. | 357/72 |
| 3,763,403 | 10/1973 | Lootens | 357/72 |
| 3,783,347 | 1/1974 | Vladik | 357/72 |
| 4,599,636 | 7/1986 | Roberts et al. | 357/72 |

FOREIGN PATENT DOCUMENTS 0154562 9/1985 European Pat. Off. .
1115824 4/1956 France .
67455 4/1973 Luxembourg .

OTHER PUBLICATIONS

Electronics, Book 59, (1986) Aug., No. 29, J. Gosch: "Implosion Package Speeds Diode Production".

Primary Examiner—Rolf Hille
Assistant Examiner—S. V. Clark
Attorney, Agent, or Firm—Thomas L. Peterson

[57] ABSTRACT

This semiconductor device has two leads (3) lying in the same axis, a prefabricated plastic can (1) which is filled with a plastic compound and has one of the leads passed through its bottom (1a), and a prefabricated die (4) attached between those sides of the inner ends (60, 70) of the leads (3) facing each other, the leads being inserted into, and having an offset within, the can.

In the manufacturing method the manufacture of the leads starts with a wire (30) which unwinds from a spool (39), passes through a major part of the manufacturing stages unseparated, and is separated into the individual semiconductor devices only after the mounting of the cans (1).

21 Claims, 2 Drawing Sheets

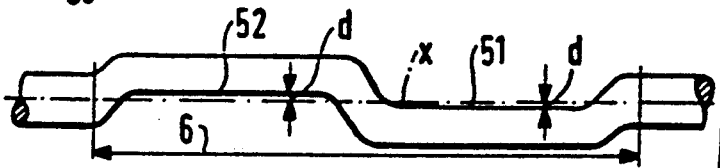
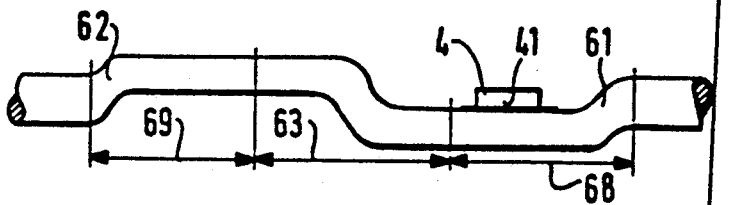
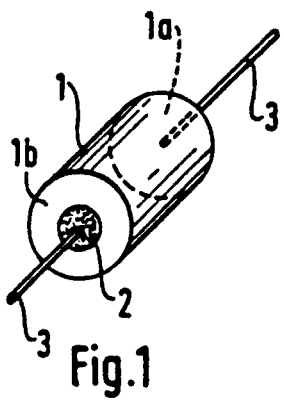
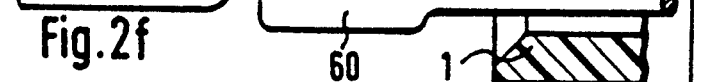
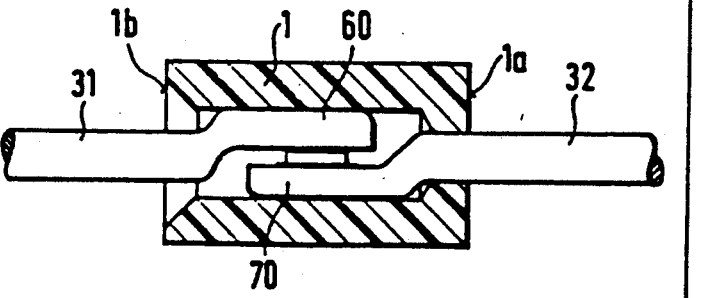
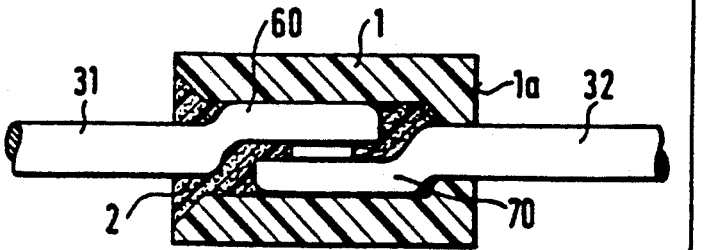

SEMICONDUCTOR DEVICE, METHOD OF MANUFACTURING THE SAME, AND APPARATUS FOR CARRYING OUT THE METHOD

TECHNICAL FIELD

The present invention relates to a method of manufacturing a semiconductor device, the apparatus for carrying out the method and to the resulting device.

BACKGROUND

One of the currently widely used plastic packages for two-lead semiconductor devices, such as diodes—particularly rectifiers (currents of up to about 1 A and reverse voltages of about 100 V to 2 kV)—varistors or thermistors, has the shape of a cylinder with leads projecting in the same axis. The semiconductor die or chip and the inner ends of its leads are hermetically embedded in the plastic, e.g., a thermoplastic or a thermosetting plastic, and thus protected against physical damage and chemical influences, such as the entrance of moisture.

In the fabrication of such semiconductor devices with a plastic package, the manufacture of the die, i.e., a semiconductor chip, starts with a semiconductor wafer on which several 100 to several 1000 identical dies or chips are fabricated, and the leads for the semiconductor device are designed as plug leads ("head leads"), i.e., leads having a thickened, e.g., upset, portion at one end, the "head". Between the two heads, the die is attached by soldering, for example.

To achieve a high throughput, a large number of untinned plug leads is fed into magazines, a die, i.e., a semiconductor chip, is positioned on each of the heads, and the heads of other plug leads fed into a further magazine are placed on the dies. In a furnace, each of the dies is then connected with its two associated plug leads by soldering. If the finished semiconductor device is to have a high reverse voltage, the soldered dies are etched and covred with a suitable plastic.

Next, the semiconductor devices are transferred into molds where they are embedded in plastic. Only then are the leads of the individual semiconductor devices tinned, which is done by barrel tinning to achieve a high throughput. Then, however, the leads, which are bent during the tinning process, must be axially aligned again in suitable straightening devices. Only then are they tested, taped, and lettered.

Conventional straightening devices have an hourly throughput of about 20,000 semiconductor devices. As the prices of semiconductor devices are still falling, this throughput rate is much too low if low-cost volume production is to be achieved.

Although the manufacturing process described is a well proved high-volume process, efforts are being made to modify it, particularly ith a view to further reducing the manufacturing costs, and to provide semiconductor devices which can be made at even lower cost.

Accordingly, the object of the invention as claimed is to provide a semiconductor device which has a plastic package that is of a different design than the hitherto widely used plastic packages to achieve a cost reduction. The design of the leads is to differ from the conversational design, too. In the method, the above-described step of straightening the leads is to be eliminated. The same applies to the tinning following the molding or embedding. It is also within the scope of the object of the invention to provide an apparatus with which a higher hourly throughput of semiconductor devices is attainable.

One of the fundamental ideas of the invention is to manufacture the plastic package, hitherto formed by embedding or molding the die, as a can-shaped housing in a separate step, which offers the advantage of greater freedom in the choice of the starting plastic and the temperatures and pressures to be used in the packaging process, for example, as to fill the can with a plastic compound, such as a cast resin, after insertion of the die.

Another fundamental idea of the invention is the completely different starting point for the manufacture of the leads, namely to form the latter from a wire unwinding from a spool, to pass this wire through a major part of the manufacturing stages unseparated, and to separate it into the individual semiconductor devices only after formation of the plastic package, i.e., the mounting of the cans.

The invention offers the following advantages. A low-cost plastic can be used for the cans. The presses for producing the can-shaped housing can be simpler in construction and, thus, smaller than the presses used so far. The need for the straightening device described is eliminated, so that a higher hourly throughput is possible. No polarity-determining device followed by a turn-over device is necessary, so that the semiconductor devices can be taped in the same direction without the turnover device, since the dies can be brought from the semiconductor wafer to the positions between the leads with a predetermined polarity, which can be maintained until the taping takes place.

BRIEF DESCRIPTION OF THE DRAWINGS

The invention will now be explained in greater detail with reference to the accompanying drawings, in which:

FIG. 1 is a perspective view of a preferred embodiment of the semiconductor device according to the invention;

FIG. 2a-2h show the course of the manufacture of a preferred embodiment of the invention.

DETAILED DESCRIPTION

Figure 3:
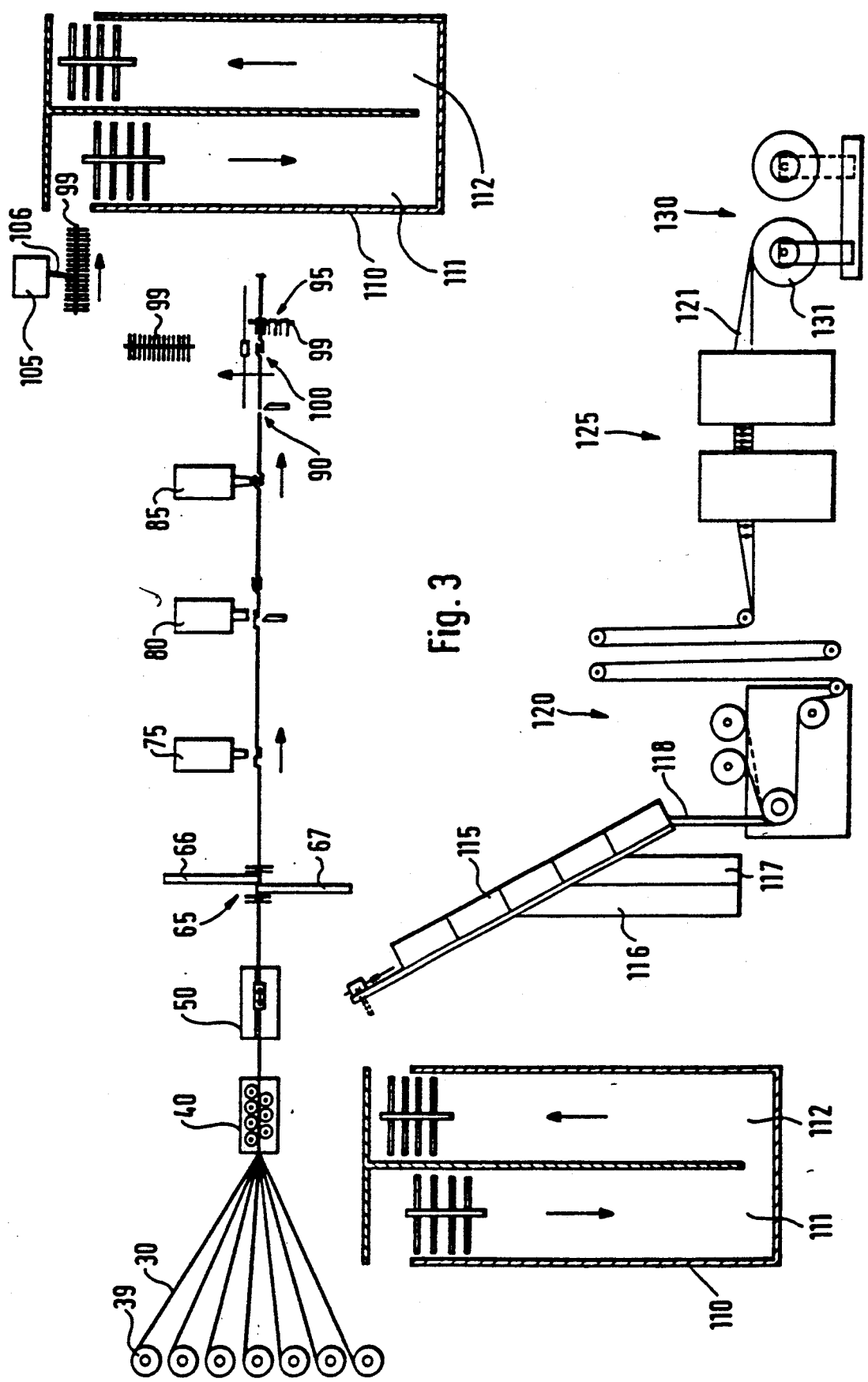
FIG. 3 shows an embodiment of the various stations of the apparatus according to the invention in a highly schematic representation.

The perspective view of FIG. 1 shows an embodiment of a finished semiconductor device according to the invention which comprises the cylindrical, can-shaped housing 1, henceforth briefly called "can", and the two leads 3.

At the front end 1b of can 1, the filled-in and cured cast resin 2 can be seen. The rear lead 3 in FIG. 1 was passed through the bottom 1a of the can 1, from which it projects.

The eight illustrations, FIGS. 2a-2h, show successiv stages of the manufacture of a preferred embodiment of the invention, namely a semiconductor device with leads of circular cross section. This embodiment is particularly suitable for the above-mentioned rectifiers with the specified electrical characteristics. The piece of wire 30 shown in FIG. 2a is the one on which the steps necessary to form the inner lead ends for attaching the die are performed.

FIG. 2b shows how an offset portion 6, which is shaped like a Z in a preferred embodiment of the invention, is formed in the wire 30 of FIG. 2a by means of a suitable tool. It is also readily possible to form a single offset, in which case the offset extends continuously from the left-hand beginning to the right-hand end of the offset portion 6, so that the piece of wire is approximately shaped like a tray.

Simultaneously with the formation of the offset, the wire 30 is flattened in the area of action of the offsetting tool, so that flat mounting surfaces 51, 52 for a semiconductor chip die result. The distance d between the wire axis x and the mounting surfaces 51, 52 should be approximately equal to half the thickness of the chip or die.

FIG. 2c shows that chip or die 4 is placed with one of its main surfaces, 41, on one of the mounting surfaces, 51 (FIG. 2b), near the offset point 61. FIG. 2d shows that the middle portion 63 is cut out to obtain the inner lead ends 60, 70. FIG. 2e shows the condition after the free lead end 70 obtained by cutting off the middle portion 63 has been moved onto the die 4 and joined to the other main surface 42 of the latter.

As shown in FIG. 2f, the can 1 is then slipped over the lead 32 until it occupies the position shown in FIG. 2g, i.e., until the inner lead ends 60, 70 are completely within the can, with the leads 31, 32 projecting axially therefrom. The internal dimensions of the can and the dimensions of the lead ends 60, 70 must be so adapted to one another that the offset points 61, 62 (FIG. 2c) lie completely within the can 1. Furthermore, the internal width of the can 1 must be adapted to the external dimensions of the inner lead ends 60, 70 with the die 4 lying therebetween, or the hole in the bottom 1a must be adapted to the diameter of the lead 32, such that a slight force fit is obtained, so that the can 1 will not fall off during the subsequent process steps.

FIG. 2h shows the cast resin 2 in the can 1, which fills up the entire hollow space of the can 1 and, thus, hermetically seals the die 4.

Instead of a round wire, a wire of square or rectangular section can be used. In that case, no mounting surfaces 51, 52 need be formed, of course.

The sequence of operations in the manufacture of a plurality of ready-to-sell semiconductor devices is as follows. The leads 31, 32 are formed from wires coming from spool 39 (FIG. 3). In a preferred embodiment of the invention, the wire has already been tinned, but it may also be tinned after unwinding from spool 39. After the wire has been straightened and/or stretched, equally spaced offset portions 6 are formed, which may have the preferred z-shape shown in FIG. 2b, the spacing of the offset portions follows from the desired length of the leads on the finished semiconductor device taking into account the length of the removed middle portion 63. If the wire 30 is of circular section, its surface will be flattened in the offset portion during the offsetting process so as to form a flat mounting surface for the die. The latter is then attached with one of its main surfaces, 41, to the offset portion near one of the offset points, 61. The middle portion 63 is cut out; if only one offset is present, it suffices to simply cut the offset portion 6 at its middle. In the latter case, the resulting free offset portion is then moved onto the other main surface 42 of the die 4 by axially rotating the lead 32 with the die 4 through 180° and then moving the free offset portion onto the die. The main surface 42 of the die 4 is then joined to this free offset portion. In a preferred variant of the method, the joints are made by soldering using a hydrogen flame for each die which burns in an excess of hydrogen, either in two separate, successive steps for the two main surfaces 41, 42 or in a single, simultaneous step, so that no flux is necessary to solder the metallized main surfaces 41, 42 of the chip or die 4 to the tinned wire 30. The wires to be soldered may also be heated on a hot plate, or instead of soldering, a conductive adhesive may be used. The can 1 is then slipped over the lead ends 60, 70 provided with the die 4, after which the necessary quantity of cast resin 2 is filled in and cured. Finally, the mechanically finished semiconductor devices are tested, and those lying in a predetermined "go" range are taped and subsequently lettered, while those found defective are discarded, and those which are other than go are taped, too, and lettered otherwise.

FIG. 3 is a highly schematic representation showing the construction of an apparatus according to the invention for manufacturing semiconductor devices according to the invention by the method described. The manufacture starts with the spools of wire 39 from which the wires 30 run to the straightening station 40 and the stretching station 50, which straighten and stretch each of the wires 30. This straightening and stretching is done only once during the entire manufacturing process of the semicondutor devices, namely at the beginning of the process, so to speak, and the subsequent stations and process steps are so designed and performed as to leave the straightness of the wires unchanged. This straightening and stretching stations 40, 50 contain a corresponding substation for each of the wires 30, which is not shown in FIG. 3; the convergence of the seven wires 30 at the inlet end of the straightening station 40, which are shown at the left in FIG. 3, is to illustrate only that all wires enter the station 40.

After leaving the stretching station 50, the wires enter the offsetting station 65, of which FIG. 3 shows the two offsetting punches 66, 67, which, if the wires 30 are circular in section, simultaneously form the mounting surfaces 51, 52 (FIG. 2b) since their ends coming into contact with the wire have a corresponding flat shape. By the two offsetting punches 66, 67, the z-shaped offset shown in FIG. 2b is formed on the wire 30. If only the above-explained single offset is to be formed, one of the two offsetting punches 66, 67 can be dispensed with.

The offsetting station 65 naturally contains as many offsetting punches or pairs of offsetting punches as there are wires to be worked simultaneously, i.e., about 100, for example. Instead of the offsetting punches, a suitable rolling device can be used for all wires.

After leaving the offsetting station 65, the offset wire enters the die or chip placement station 75, in which a chip or 4 die is placed on the offset portion or, if a z-shaped offset was formed, on one of the offset portions. This, too, takes place simultaneously for all wires, i.e., dies are placed on each of the above-mentioned about 100 wires simultaneously, such that in all dies, the same semiconductor region is connected with the respective wire, e.g., the N-type region. In the case of the above-mentioned tinned wires, it is advantageous to provide the two semiconductor regions of the dies already on the semiconductor wafer with a metal layer, e.g., by vaport deposition, which permits the semiconductor region to be soldered to the tin coating. Metals suitable for this purpose are gold, palladium, and silver, for example.

The simultaneous placement of the about 100 dies on the wires may proceed as follows. The semiconductor wafer, scribed by sawing as usual, is diced with the orientation of the dies being retained, and the individual dies are transferred into a magazine, from which they are placed, e.g., by means of suction pipettes, on an alignment plate, where their lateral edges are aligned parallel to each other and brought to exactly the same distance between them. This process can be easily automated by means of an optical monitoring facility. The aligned dies are then placed on the mounting surfaces of the wires by a further set of suction pipettes.

The placement station 75 is followed by the first cutting and feed station 80, in which the offset portion 6 (FIG. 2b) is cut through, or in which the middle portion 63 (FIG. 2c) is cut out of the offset wire. After the cutting operation, the "left" free offset portion 70 thus obtained is moved onto the die 4 by causing the wire to perform a corresponding forward movement, while the "right" wire is held in place.

The station 80 is followed by the die attachment station 85, in which the two main surfaces 41, 42 of the die 4 (FIGS. 2c, d) are soldered to the tinned wire. This is done, for example, by means of the above-mentioned individual hydrogen flames operating in an excess of hydrogen, so that the tin is reduced by the excess hydrogen and no flux is necessary, whose residues would have to be removed in a subsequent cleaning process. The invention thus has the additional advantage that throughout the attachment of the leads, no chemical steps are necessary.

The station 85 is followed by the second cutting station 90, in which the, e.g., 100 wires are cut through simultaneously. At this point, the separation into a prestage of the finished semiconductor devices takes place, namely into the manufacturing stage in which the cans 1 are slipped over the inner lead ends 60, 70 (FIGS. 2e to 2h) and filled with cast resin.

The cans, which were previously fed, e.g., in hundreds, into the magazine 99 in the station 95, are slipped over the inner lead ends in the can-mounting station 100. The respective arrangements 32, 60, 70, 31 are inserted into the cans, as shown in FIGS. 2f to 2h. To facilitate the insertion into the can 1, the latter is chamferred at its opening 1b. Behind the second cutting station 90, the direction of conveyance changes by 90°, and the respective magazine 99, now containing the canned semiconductor devices, is conveyed to the plastic-compound-filling station 105, in front of which the direction of conveyance is again changed by 90°, so that the openings 1a of the cans 1 are arranged below the outlets of the filling station 105. The number of the outlets is equal to the number of cans in each magazine, i.e., about 100, for example. For simplicity, however, only one outlet 106 is shown in FIG. 3.

In the magazine 99, the nearly finished semiconductor devices are transferred to the curing station 110, which consists of a heating portion 111 and a cooling portion 112. The magazine 99 are taken from the outlet of the cooling portion 112 and emptied into the filler inlet of the testing station 115. Since FIG. 3 is divided into two halves, the curing station 110 is shown both in the upper half and the lower half; this only serves to facilitate an understanding of the invention and does not mean that two curing stations are present.

The testing and sorting station 115 shown in the embodiment of FIG. 3 tests and sorts the about 100 semiconductor devices simultaneously, but only in three groups, thus comprising only the "no-go" container 116, the container 117 for semiconductor devices having properties other than the set "go" condition, and the outlet 118 for the devices lying in the "go" range. After the semiconductor devices which are "no-go" and "other than go" have been sorted out, the "go" devices, handled in parallel up to this point, are transferred serially, i.e., successively in time, to the taping station 120 and thence to the lettering station 125. In the reeling station 130, the tape 120 mounted with the lettered, ready-to-sell devices, is finally wound on reels 131.

We claim:

1. A semiconductor device comprising:
   two leads aligned along a common axis and having inner end portions facing each other;
   a prefabricated, can-shaped, cylindrical, plastic housing having a bottom with an aperture therein at one end and an open top at the other end, one of said leads passing through said aperture, and the other of said leads extending out of said open top;
   a prefabricated semiconductor die attached between said inner end portions of said leads; and
   a plastic cast resin compound filling the interior of said housing and encapsulating said inner end portions of said leads and said semiconductor die.

2. A semiconductor device as claimed in claim 1 wherein at least one lead is offset within said housing.

3. A semiconductor device as claimed in claim 1 wherein said leads are of circular section and are disposed with said inner ends in overlapping facing relationship, the facing sides of said facing end portions being deformed to provide mounting surfaces for said semiconductor die.

4. A semiconductor device comprising:
   (a) two leads (3) lying in the same axis, each lead having an end (60, 70) adjacent an end of the other lead, the adjacent ends of each lead having a mounting surface (51, 52) facing each other for receiving a chip;
   (b) a prefabricated semiconductor chip (4) attached between the mounting surface (51, 52) of the leads (3);
   (c) a prefabricated, can-shaped, plastic housing (1) having a first opening which is sized to just receive that portion of said two leads between which said chip is attached and a second opening smaller than said first opening, said second opening being sized to receive one of said leads, said can-shaped, plastic housing being disposed about an engaging said portion of said two leads with said second opening receiving one of said two leads and said can-shaped, plastic housing otherwise being filled with a plastic compound, preferably a cast resin (2).

5. The device of claim 4, wherein at least one lead (31; 32) is offset within said can-shaped, plastic housing (1).

6. The device of claim 5, wherein said leads (3) are of circular cross-section and are deformed at their ends so as to form said mounting surfaces (51, 52).

7. The device of claim 6, wherein both of said leads (3) are offset within said can-shaped, plastic housing (1).

8. The device of claim 7, wherein said leads are offset a distance 'd' from their major axes, said distance 'd' being equal to one half the thickness of said chip (4).

9. The device of claim 8, wherein said housing is elongated and has first and second ends, said first opening in said can-shaped, plastic housing flaring unto said first end thereof and said second opening flaring into said first opening.

10. The device of claim 4, wherein both of said leads (3) are offset a distance 'd' from their major axes, said distance 'd' being equal to one half the thickness of said chip (4).

11. The device of claim 4, wherein said first opening is said can-shaped, plastic housing is sized to form an inference fit with said portion of said two leads.

12. The device of claim 4, wherein said chip provides a semiconductor diode.

13. A semiconductor device comprising:
(a) two leads (3) lying in the same axis, each lead having an end (60, 70) adjacent an end of the other lead, the adjacent ends of each lead having a mounting surface (51, 52) facing each other for receiving a chip;
(b) a prefabricated semiconductor chip (4) attached between the mounting surfaces (51, 52) of the leads (3);
(c) a prefabricated, can-shaped, plastic housing (1) having a first opening which is sized to receive that portion of said two leads between which said chip is attached and a second opening smaller than said first opening, said second opening being sized to just receive one of said leads, said can-shaped, plastic housing being disposed about said portion of said two leads with said second opening engaging one of said two leads and said can-shaped, plastic housing otherwise being filled with a plastic compound, preferably a cast resin (2).

14. The device of claim 13, wherein at least one lead (31; 32) is offset within said can-shaped, plastic housing (1).

15. The device of claim 14, wherein said leads (3) are of circular cross-section and are deformed at their ends so as to form said mounting surfaces (51, 52).

16. The device of claim 15, wherein both of said leads (3) are offset within said can-shaped, plastic housing (1).

17. The device of claim 16, wherein said leads are offset a distance 'd' from their major axes, said distance 'd' being equal to one half the thickness of said chip (4).

18. The device of claim 17, wherein said housing is elongated and has first and second ends, said first opening in said can-shaped, plastic housing flaring unto said first end thereof and said second opening flaring into said first opening.

19. The device of claim 13, wherein both of said leads (3) are offset a distance 'd' from their major axes, said distance 'd' being equal to one half the thickness of said chip (4).

20. The device of claim 13, wherein said second opening is said can-shaped, plastic housing is sized to form an inference fit with said one of said two leads.

21. The device of claim 13, wherein said chip provides a semiconductor diode.

* * * * *